United States Patent [19]
Ishii et al.

[11] Patent Number: 5,825,642
[45] Date of Patent: Oct. 20, 1998

[54] POWER SUPPLY APPARATUS

[75] Inventors: Hideo Ishii, Minoo; Haruo Moriguchi, Itami, both of Japan; Nathaniel S. Hansen, Hanover; Michael R. Dumont, Lebanon, both of N.H.

[73] Assignees: Sansha Electric Manufacuring Co. Limited, Osaka, Japan; Thermal Dynamics Corporation, West Lebanon, N.H.

[21] Appl. No.: 863,137

[22] Filed: May 27, 1997

[30]  Foreign Application Priority Data

Nov. 8, 1996  [JP]  Japan ................................. 8-313063

[51] Int. Cl.⁶ .................................................. H02M 1/00
[52] U.S. Cl. ................................ 363/141; 363/21; 361/25
[58] Field of Search ............................... 363/141, 21, 89, 363/41, 37, 97; 361/31, 25, 27, 33, 695; 165/40, 80.3

[56]  References Cited

U.S. PATENT DOCUMENTS

| | | | |
|---|---|---|---|
| 4,656,553 | 4/1987 | Brown | 361/31 |
| 4,777,575 | 10/1988 | Yamato et al. | 363/21 |
| 5,484,012 | 1/1996 | Hiratsuka | 165/40 |
| 5,517,399 | 5/1996 | Yamauchi et al. | 363/89 |

FOREIGN PATENT DOCUMENTS 6-7938   1/1994   Japan .

*Primary Examiner*—Peter S. Wong
*Assistant Examiner*—Rajnikant B. Patel
*Attorney, Agent, or Firm*—William H. Murray, Esq.

[57]  ABSTRACT

A power supply apparatus includes a housing containing therein a component which generates heat when operating, a fan for cooling the heat-generating component, and a driving unit for driving the fan. The housing also contains therein a temperature detector for detecting the temperature in the housing and providing a detected-temperature representing signal. In response to the detected-temperature representing signal, a control unit provides the driving unit with a control signal to change the rotation speed of the fan.

11 Claims, 7 Drawing Sheets

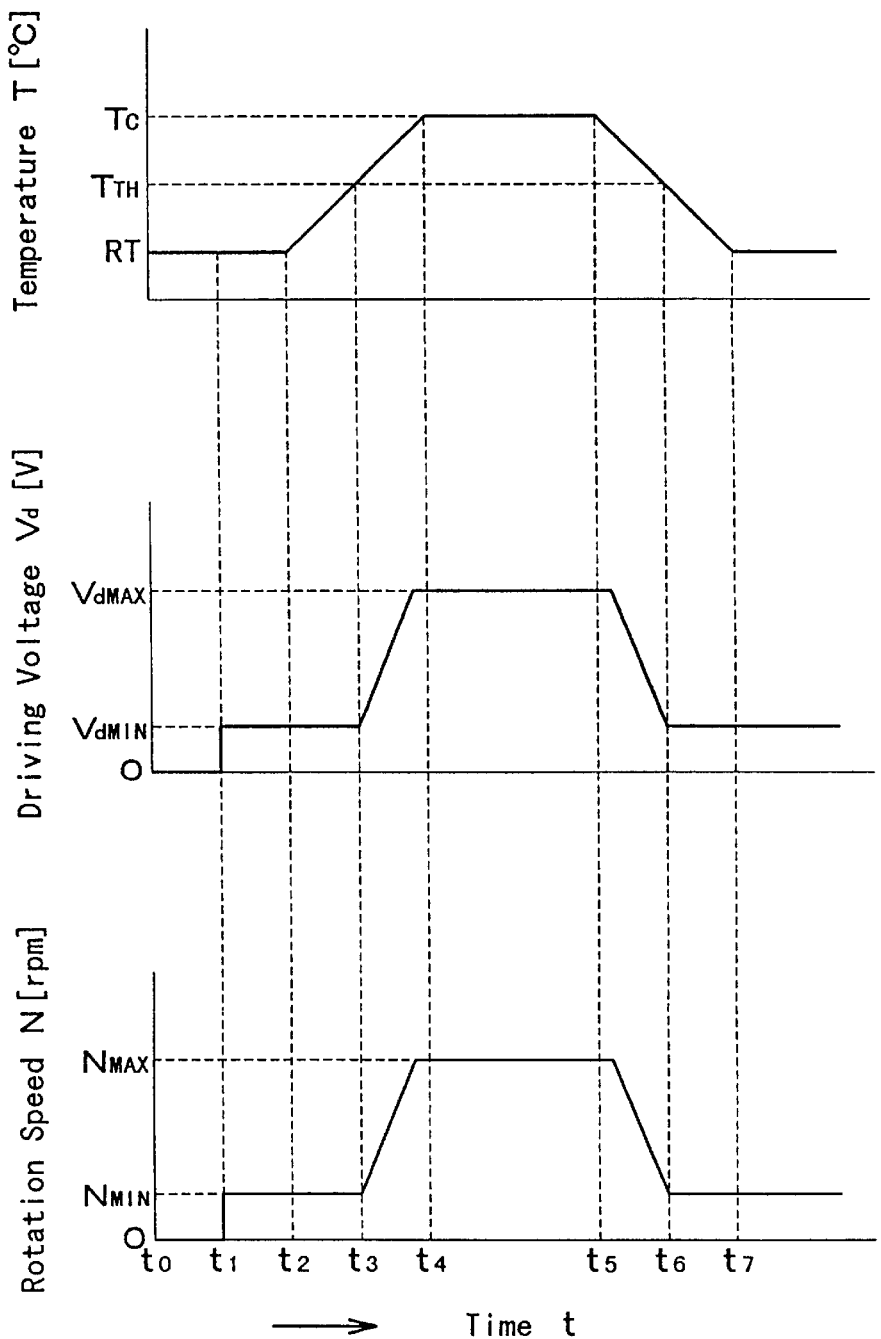

POWER SUPPLY APPARATUS

This invention relates to a power supply apparatus including a heat-generating component, e.g. a power semiconductor device, and a fan for cooling such component.

BACKGROUND OF THE INVENTION

Power supply apparatuses include a DC power supply apparatus configured as follows. An input rectifying circuit converts an input AC voltage supplied from a single-phase AC power supply into a DC voltage, which is, in turn, converted to a high-frequency voltage by an inverter. The high-frequency voltage is lowered to a predetermined value by a small-sized high-frequency voltage transformer. The lowered high-frequency voltage is re-converted by an output rectifying circuit to a DC voltage for application to a load.

Use of a small-sized transformer in a power supply apparatus permits reduction of the size of a housing of the apparatus. Some components, however, generate heat during operation, and, therefore, the temperature in a small housing is apt to rise, which may result in high thermal stress on the components. To avoid thermal stress, the components must be cooled. Various cooling methods have been proposed, among which a system using a cooling fan is often employed because of its simple arrangement and low cost. In a conventional cooling fan system, a motor disposed in a housing of a power supply apparatus drives a fan to produce an air flow for cooling heat-generating components. The motor, which may be an induction motor, is driven from an input AC voltage supplied from the single-phase AC power supply, throughout the operation of the power supply apparatus, and rotates always at a rated rotation speed. The rotation speed mentioned herein is a quantity which may be indicated by e.g. the number of revolutions per minute or per second.

When a load of the power supply apparatus consumes low electrical power, the components of the power supply apparatus generate a small amount of heat, so that the temperature in the housing does not much rise and, therefore, the components need not be strongly cooled. Thus, it is preferable to drive the motor to cool the components in the housing in accordance with a current temperature in the housing, in order to save power. In the above-described conventional power supply apparatus, however, the motor is rotated always at its rated rotation speed to drive the fan to cool the components, regardless of the temperature in the housing, which is uneconomical.

Such conventional power supply apparatus may be used with an apparatus which is often used outdoors, e.g. for an arc welder or an arc cutter. The motor of such power supply apparatus, however, is driven to rotate at its rated rotation speed. Accordingly, a large amount of dust is sucked into the power supply apparatus housing and settled on the components. Such dust may prevent heat from the components from being dissipated sufficiently even during operation of the cooling fan. The dust deposited in the housing deteriorates insulation property of the components, which may cause failure of the power supply apparatus.

Use of the above-described conventional power supply apparatus with an apparatus which is installed indoors, such as a storage battery charger or a communications apparatus, causes discomfort due to loud noise produced by the motor rotated at a rated rotation speed.

SUMMARY OF THE INVENTION

A power supply apparatus according to the present invention includes a housing, components which generate heat when operating, and a fan for cooling the components. The power supply apparatus of the present invention further includes a driving unit for driving the fan in response to a control signal, temperature representing signal generating means for generating a temperature representing signal representative of the temperature in the housing, and control means responsive to the temperature representing signal for generating the control signal for changing the rotation speed of the fan.

Means for detecting the temperature in the housing and generating a signal representative of the detected temperature may be used as the temperature representing signal generating means.

The control means may include difference calculating means and control signal generating means. The difference calculating means generates a difference signal representative of the difference between the value of the temperature representing signal and a predetermined reference value. When the difference signal indicates that the temperature representing signal is smaller than the reference value, the control signal generating means generates a control signal for setting the fan rotation speed to a predetermined, substantially constant value of zero or greater. When the difference signal indicates that the temperature representing signal is equal to or greater than the reference value, the control signal generating means generates a control signal for changing the fan rotation speed to the predetermined value or a greater value which is in proportion to the difference signal.

The control signal generating means may be arranged to generate a control signal for setting the fan rotation speed to zero when the difference signal indicates that the temperature representing signal is smaller than the reference value, and to generate a control signal for rotating the fan at its substantially maximum rotation speed for a predetermined time period immediately after the temperature representing signal becomes equal to or greater than the reference value, and then for changing the fan rotation speed to a value proportional to the difference.

In accordance with another aspect of the power supply apparatus of the present invention, power detecting means for detecting output power of the power supply apparatus is used as the temperature representing signal generating means.

The power detecting means may include voltage detecting means for detecting an output voltage of the power supply apparatus, current detecting means for detecting output current of the power supply apparatus, and multiplying means for multiplying the outputs of the voltage detecting means and the current detecting means. Alternatively, only the current detecting means may be used as the temperature representing signal generating means.

BRIEF DESCRIPTION OF THE DRAWINGS

FIG. 2 illustrates changes of a housing temperature, a fan driving voltage and a fan rotation speed in the first embodiment;

DETAILED DESCRIPTION OF PREFERRED EMBODIMENTS

Figure 1:
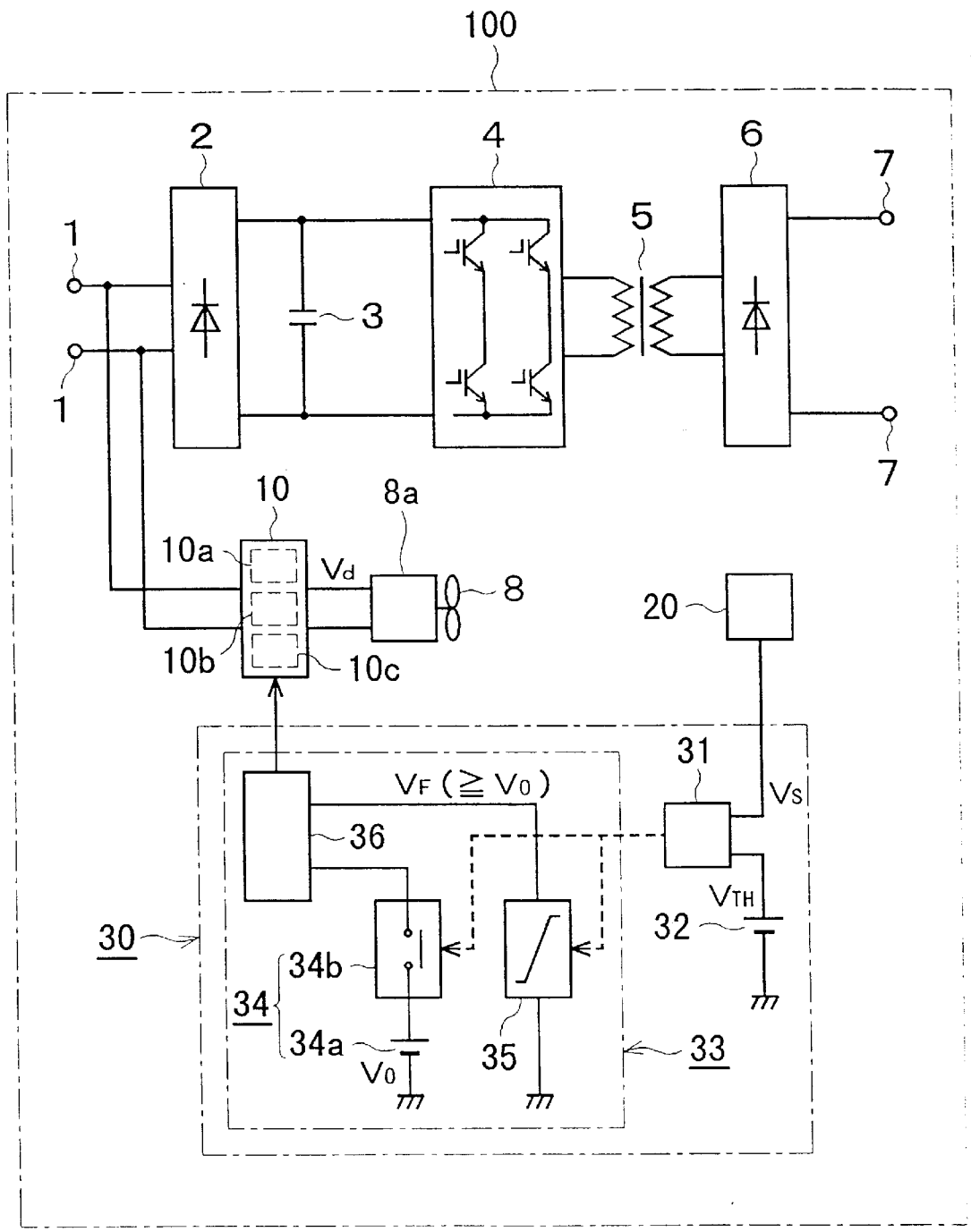
FIG. 1 is a block diagram of a power supply apparatus according to a first embodiment of the present invention.

As shown in FIG. 1, in a power supply apparatus according to a first embodiment of the present invention, an input AC voltage applied from a single-phase AC power supply (not shown) between input terminals 1, 1 is rectified by an input rectifier 2 which may comprise diodes. The resulting DC voltage is smoothed by a smoothing capacitor 3. The smoothed DC voltage is converted into a high-frequency voltage by an inverter 4 which may comprise a bridge circuit including semiconductor switching devices, e.g. thyristors, bipolar transistors or insulated gate bipolar transistors (IGBT). The switching devices are ON-OFF controlled by an inverter control circuit (not shown) so as to provide a high-frequency voltage. The high-frequency voltage provided by the inverter 4 is lowered to a predetermined value by a small-sized high-frequency transformer 5. The lowered high-frequency voltage is re-rectified by an output rectifier 6 comprising e.g. diodes and applied from output terminals 7, 7 to a load (not shown).

The aforementioned components are disposed in a single housing 100. These components, in particular, the input rectifier 2, the inverter 4, and the output rectifier 6 generate heat when they operate, and, therefore, the temperature in the housing 100 is raised. A fan 8 is disposed in the housing 100, which is driven to rotate by a DC motor 8a for cooling the components in the housing 100. The fan 8 is operated in accordance with the temperature in the housing 100. For that purpose, the power supply apparatus includes a driving unit 10 for driving the DC motor 8a, a temperature detector 20 for detecting the temperature in the housing 100 and producing a signal representing the detected temperature, and a control unit 30 for generating a control signal in accordance with the temperature representing signal. The control signal is applied to the driving unit 10.

The AC voltage from the single-phase AC power supply is also applied to the driving unit 10 via the input terminals 1, 1. The driving unit 10 converts the AC voltage into a variable DC voltage Vd in accordance with the control signal from the control unit 30, and applies the voltage Vd to the motor 8a. The driving unit 10 has a rectifying circuit 10a comprising an AC-voltage rectifying diode bridge. The output of the rectifying circuit 10a is coupled to a chopper circuit 10b which chops the output voltage of the rectifying circuit 10a. The chopper circuit 10b includes a semiconductor switching device, e.g. a thyristor, a bipolar transistor, or an IGBT. The output of the chopper circuit 10b is coupled to a smoothing circuit 10c having a smoothing reactor which smooths the output of the chopper circuit 10b. In order to change the value of the DC voltage Vd, the semiconductor switching device of the chopper circuit 10b is ON-OFF controlled in accordance with the control signal. For example, the semiconductor switching device may be ON-OFF controlled in accordance with the duty ratio of a PWM control pulse signal.

The temperature detector 20 includes a temperature sensing device, e.g. a thermistor, a posistor, or a thermocouple. The temperature detector 20 detects the temperature in the housing 100 and provides a detected temperature representing signal, for example, a DC voltage Vs, to the control unit 30. The temperature detector 20 is disposed at the hottest place in the housing 100 where the air flow from the fan does not affect the detector 20 and the detector 20 does not affect performance of the components. For example, the temperature detector 20 may be mounted on a heat sink for the diodes of the input rectifier 2 or on a heat sink for the semiconductor switching devices of the inverter 4.

The control unit 30 has difference calculating means, which may be a differential amplifier 31. The differential amplifier 31 calculates the difference between the detected temperature representing voltage Vs and a predetermined reference signal, e.g. a DC reference voltage $V_{TH}$ provided by a reference voltage source 32. When the detected temperature representing voltage Vs is smaller than the reference voltage $V_{TH}$, the differential amplifier 31 provides a negative DC voltage proportional to the difference to a pulse signal generating unit 33. When the detected temperature representing voltage Vs is equal to or greater than the reference voltage $V_{TH}$, the differential amplifier 31 provides to the pulse signal generating unit 33 a zero voltage or a positive DC voltage which is greater than zero and proportional to the difference. The reference voltage $V_{TH}$ corresponds to a reference temperature above which thermal stress is imposed on the components of the power supply apparatus. For example, the reference voltage $V_{TH}$ may be the detected temperature representing voltage Vs generated when the heat sink on which the temperature detector 20 is mounted is at a temperature of about 40° C.

The pulse signal generating unit 33 includes a minimum rotation speed setting voltage source 34, a rotation speed varying voltage source 35, and a PWM control pulse signal generating circuit 36. The minimum rotation speed setting voltage source 34 and the rotation speed varying voltage source 35 receive the output voltage of the differential amplifier 31. When the output voltage of the differential amplifier 31 is negative, a DC voltage $V_0$ is applied from the minimum rotation speed setting voltage source 34 to the PWM control pulse signal generating circuit 36. When the output voltage of the differential amplifier 31 is zero or positive, the rotation speed varying voltage source 35 provides a DC voltage $V_F$ to the PWM control pulse signal generating circuit 36.

The minimum rotation speed setting voltage source 34 includes a DC voltage source 34a which provides a predetermined voltage, for example a positive DC voltage $V_0$, and an analog switch 34b coupled to the output terminal of the DC voltage source 34a. When the output voltage of the differential amplifier 31 is negative, the switch 34b is closed to couple the DC voltage $V_0$ to the PWM control pulse signal generating circuit 36. When the output voltage of the differential amplifier 31 is zero or positive, the analog switch 34b is opened, so that the DC voltage $V_0$ is decoupled from the PWM control pulse signal generating circuit 36.

The rotation speed varying voltage source 35 applies the DC voltage $V_F$ to the pulse signal generating circuit 36 when the output voltage of the differential amplifier 31 is zero or positive. The DC voltage $V_F$ is proportional to the level of the output voltage of the differential amplifier 31 and equal to or greater than the output voltage $V_0$ of the DC voltage source 34a.

The PWM control pulse signal generating circuit 36 generates a PWM control pulse signal which is applied to the driving unit 10. The PWM control pulse signal has a duty ratio corresponding to the DC voltage $V_0$ provided by the minimum rotation speed setting voltage source 34, or a duty ratio proportional to the DC voltage $V_F$ provided by the rotation speed varying voltage source 35. In response to the PWM control signal having a duty ratio corresponding to the DC voltage $V_0$, the driving unit 10 generates the driving voltage Vd which is equal to a predetermined value $Vd_{MIN}$ for causing the fan 8 to rotate at a predetermined minimum rotation speed $N_{MIN}$. When the output of the differential amplifier 31 is zero or positive, the driving unit 10 generates the driving voltage Vd which is equal to or greater than $Vd_{MIN}$, in response to the PWM control pulse signal having a duty ratio proportional to the DC voltage $V_F$. The DC voltage $V_F$ provided by the rotation speed varying voltage source 35 has an upper limit value such that the driving voltage Vd cannot exceed the driving voltage $Vd_{MAX}$ corresponding to the rated rotation speed of the motor 8a. When the PWM control pulse signal generating circuit 36 receives the DC voltage $V_F$ from the rotation speed varying voltage source 35, the fan 8 is rotated at the rotation speed proportional to the DC voltage $V_F$. The maximum rotation speed of the fan 8 is $N_{MAX}$, which corresponds to $Vd_{MAX}$.

Therefore, whatever rated voltage value, e.g. 200 V or 400 V, the input AC voltage between the input terminals 1, 1 has, normal operation of the motor 8a can be ensured by controlling the duty ratio of the PWM control pulse signal in accordance with the value of the input AC voltage.

The operation of the power supply apparatus with the aforementioned arrangement will be explained with reference to FIG. 2. When no input AC voltage is applied between the input terminals 1, 1 of the power supply apparatus, the temperature in the housing 100 is a room temperature RT (during a time period $t_0$–$t_1$ in FIG. 2(a)).

At time $t_1$, when an input AC voltage is applied between the input terminals 1, 1, the temperature detector 20 starts to detect the temperature in the housing 100. Let it be assumed that at this time point, the load has not start operating yet. No components of the power supply apparatus are generating heat, and, therefore, the temperature T in the housing 100 remains substantially at a room temperature RT. The detected temperature representing DC voltage $V_S$ is smaller than the reference voltage $V_{TH}$, and the differential amplifier 31 provides a negative DC voltage. The DC voltage $V_0$ is applied from the minimum rotation speed setting voltage source 34 to the PWM control pulse signal generating circuit 36. The PWM control pulse signal generating circuit 36 controls the duty ratio of the PWM control pulse signal, which is to be applied to the driving unit 10, in such a manner that the fan 8 is rotated at the minimum rotation speed $N_{MIN}$ (FIG. 2(c)) in accordance with the driving voltage $Vd_{MIN}$ (FIG. 2(b)) corresponding to the DC voltage $V_0$.

Next, let it be assumed that the load starts operating at time $t_2$, which causes the heat-generating components of the power supply apparatus to operate. Then, the components start generating heat. When the temperature rise in the housing 100 becomes such that it cannot be regulated by the fan 8 rotating at the minimum rotation speed $N_{MIN}$, the temperature T starts increasing. However, during a time period $t_2$–$t_3$ when the temperature representing voltage $V_S$ is smaller than the reference voltage $V_{TH}$, the differential amplifier 31 still provides a negative DC voltage for keeping the driving voltage Vd of the motor 8a at the minimum value $Vd_{MIN}$, and, thus, keeping the rotation speed of the fan 8 at the minimum rotation speed $N_{MIN}$.

When the temperature T reaches the temperature $T_{TH}$ (e.g. 40° C., FIG. 2(a)) corresponding to the reference voltage $V_{TH}$ (at time $t_3$), the differential amplifier 31 provides a positive DC voltage. When the temperature T exceeds the temperature $T_{TH}$, the positive DC voltage increases in proportion to the temperature T. The rotation speed varying voltage source 35 applies the DC voltage $V_F$ proportional to the positive DC voltage from the differential amplifier 31 to the PWM control pulse signal generating circuit 36. The PWM control pulse signal generating circuit 36 generates a PWM control pulse signal having a duty ratio proportional to the DC voltage $V_F$. The driving unit 10 receives this PWM control pulse signal and increases the driving voltage Vd. Thus, the rotation speed of the fan 8 increases with the temperature T in the housing 100.

Despite the increase of the rotation speed of the fan 8, the temperature T in the housing 100 may increase and cause the DC voltage $V_F$ to reach the upper limit. When the upper limit of the voltage $V_F$ is reached, the driving voltage Vd for the motor 8a also reaches its maximum $Vd_{MAX}$ (FIG. 2(b)), and the fan 8 is rotated at its maximum rotation speed $N_{MAX}$ (FIG. 2(c)). The temperature in the housing 100 keeps rising for a while after that. At time $t_4$, the temperature T in the housing 100 reaches the temperature Tc, at which the temperature increase is equilibrated with the cooling capacity of the fan 8 rotating at the maximum rotation speed $N_{MAX}$. Then, the temperature T remains at Tc during a time period of $t_4$–$t_5$.

At time $t_5$, when the load stops operating, the temperature T in the housing 100 starts falling. When the temperature T falls to a temperature at which the components can be cooled by the fan 8 rotating at a rotation speed lower than the maximum rotation speed $N_{MAX}$, the driving voltage Vd and thus the rotation speed of the fan 8 decrease with the temperature T.

At time $t_6$, when the temperature T decreases below $T_{TH}$, the differential amplifier 31 provides a negative voltage again. The negative voltage causes the DC voltage $V_0$ to be applied from the minimum rotation speed setting voltage source 34 to the pulse signal generating circuit 36. Thus, the driving voltage Vd becomes equal to the minimum value $Vd_{MIN}$, which causes the fan 8 to rotate at the minimum rotation speed $N_{MIN}$. At time $t_7$, the temperature T in the housing 100 reaches a temperature determined in accordance with the minimum rotation speed $N_{MIN}$.

According to the present invention, the rotation speed of the fan 8 of the power supply apparatus is varied in proportion to the temperature T in the housing 100. Therefore, the power supply apparatus of the present invention is more effective in energy-saving and more economical than a conventional power supply apparatus in which a motor for driving a fan is always rotated at a rated rotation speed regardless of the temperature variation in the housing 100.

When the power supply apparatus of the present invention is used with an apparatus which is often used outdoors, e.g. arc welders or arc cutters, the amount of dust sucked into the housing 100 is smaller than that in the conventional apparatus because the fan 8 according to the present invention is rotated at a rotation speed varying with the temperature in the housing 100. Thus, according to the present invention, deterioration in insulation property of the components of the apparatus and decrease in cooling efficiency of the cooling system which may be caused by dust deposited on the components are prevented.

The motor driving the fan 8 of the present invention is not always rotated at its rated rotation speed, and, therefore, it generates less noise than a motor of the conventional power supply apparatus. The power supply apparatus of the present invention, therefore, can be used with a storage battery charger or a communications apparatus, which is often used indoors.

The power supply apparatus according to the first embodiment can be modified variously. For example, the transformer 5 and the output rectifier 6 may be removed, so that an AC voltage from the inverter 4 may be applied to the load. The rotation speed of the fan 8 may be changed stepwise, e.g. in three steps or four steps. The differential amplifier 31 may have a hysteresis characteristic for the stabilization of its output voltage. An input three-phase AC voltage may be applied to the power supply apparatus, instead of an input single-phase AC voltage. The control unit 30 is not limited in configuration to the one of the described embodiment. The driving unit 10 also may be modified. For example, the driving unit 10 may include a phase-controlled rectifier and a smoothing circuit for smoothing an output of the phase-controlled rectifier. The motor for driving the fan 8 may be an induction motor. If an induction motor is used, an inverter is coupled to the output of the driving unit 10 to convert a DC voltage from the driving unit 10 into an AC voltage for application to the induction motor.

Figures 3A, 3B, 3C:
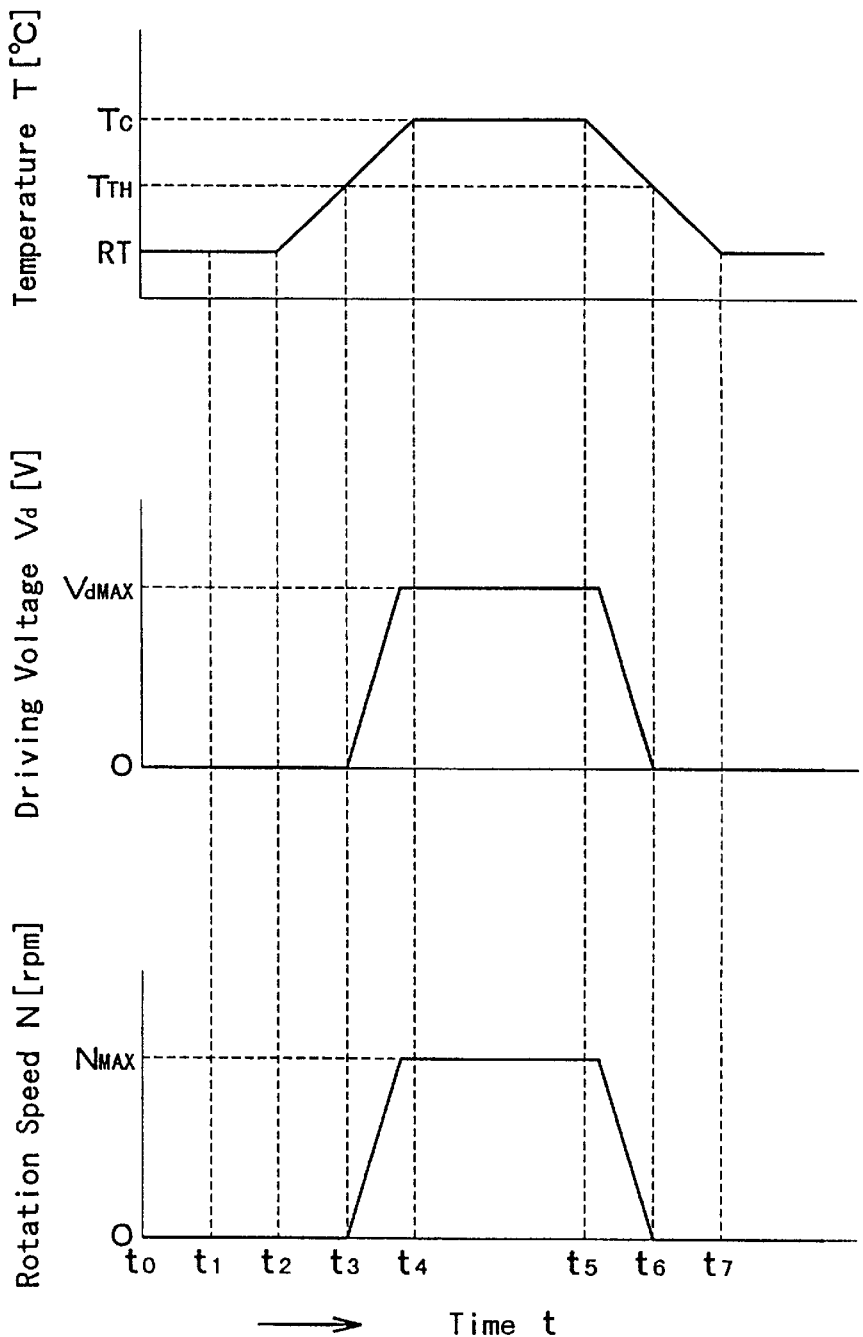
FIG. 3 illustrates changes of a housing temperature, a fan driving voltage and a fan rotation speed in a modification of the first embodiment.

The driving voltage Vd of the fan 8 may be set to zero so that the fan 8 does not operate when the temperature T in the housing 100 is $T_{TH}$ or smaller as shown in FIG. 3. With this arrangement, the amount of dust sucked into the housing 100 and noise produced by the motor driving the fan 8 are further reduced.

For this purpose, the PWM control pulse signal generating circuit 36 may be so formed as to generate a PWM control pulse signal for making the driving unit 10 generate the motor driving voltage Vd of zero when the minimum rotation speed setting voltage source 34 applies the DC voltage $V_0$ to the PWM control pulse signal generating circuit 36 in response to a negative output voltage from the differential amplifier 31. Alternatively, the minimum rotation speed setting voltage source 34 may be removed, with the pulse signal generating circuit 36 so formed as to generate a PWM control pulse signal for making the driving unit 10 generate the driving voltage Vd of zero when the differential amplifier 31 provides a negative output voltage.

Figure 4:
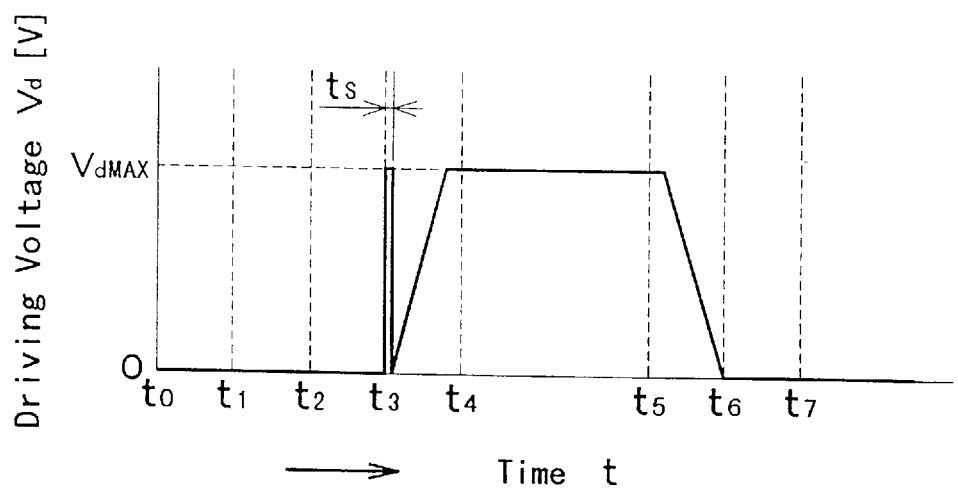
FIG. 4 illustrates changes of a fan driving voltage in a further modification of the first embodiment.

The rotation speed of the fan 8, however, may not smoothly increase due to a large friction exhibited by the motor 8a when the motor rotation speed is increased from zero. For solution of this problem, the driving voltage Vd may be raised to its maximum $Vd_{MAX}$ or to a value near to it for a short time period ts (e.g. 1–10 seconds) after the fan 8 starts rotating, as shown in FIG. 4. For this purpose, the PWM control pulse signal generating circuit 36 may be so formed as to generate a PWM control pulse signal for raising the driving voltage Vd to its maximum value or to a value near to it for the time period ts after the time point at which the output voltage of the differential amplifier 31 changes from a negative value to a positive value.

Figure 5:
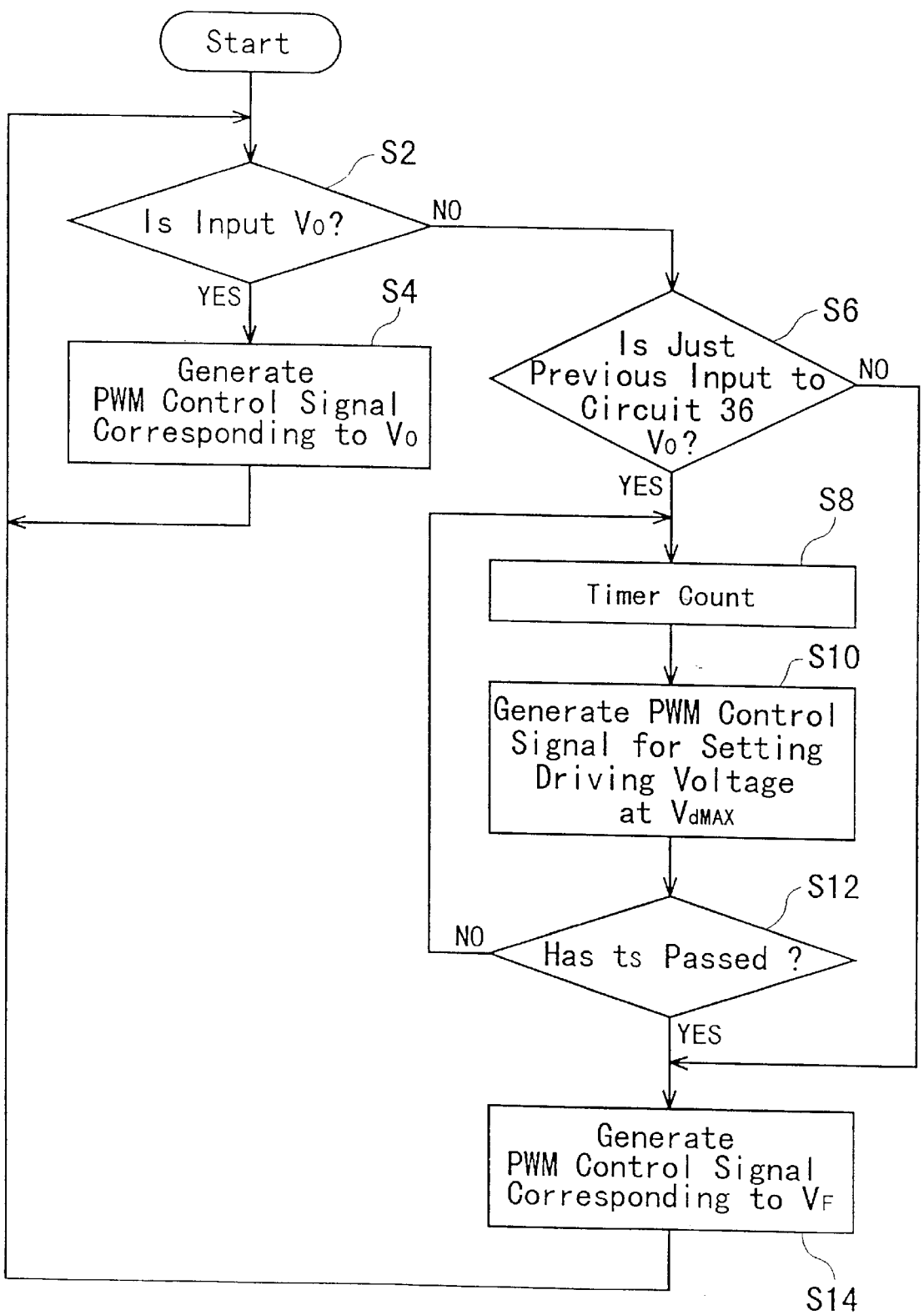
FIG. 5 is a flow chart showing operation of a driving unit in the further modification of the first embodiment.

For example, the PWM control pulse signal generating circuit 36 may comprise a CPU, e.g. a microprocessor. When the voltage $V_0$ is applied, the CPU operates in accordance with the flow chart shown in FIG. 5. The CPU determines whether the voltage applied to the CPU is $V_0$ (Step S2). If the applied voltage is $V_0$ (i.e. the answer in Step S2 is "YES"), the PWM control pulse signal for setting the driving voltage to zero is applied to the driving unit 10 (Step S4), and the processing returns to Step S2. If the answer in Step 2 is "NO", the CPU determines whether the just previously applied voltage is $V_0$ (Step S6). If the previously applied voltage is $V_0$ (i.e. the answer in Step S6 is "YES"), the CPU increments a software timer counter by one (Step S8). Next, the CPU generates a PWM control signal for causing the driving voltage $Vd_{MAX}$ to be generated (Step S10). Then, the CPU determines whether the value counted by the software counter corresponds to the time period ts (Step S12). If the answer in Step S12 is "NO", the CPU repeats the processing of Step S8 through Step S12 until the answer "YES" is obtained in Step S12. If the answer in Step S12 is "YES", the CPU generates a PWM control pulse signal corresponding to $V_F$ (Step S14). After Step S14, the CPU repeats the processing of Step S2. If the answer in Step S6 is "NO", the processing advances to Step S14.

Figure 6:
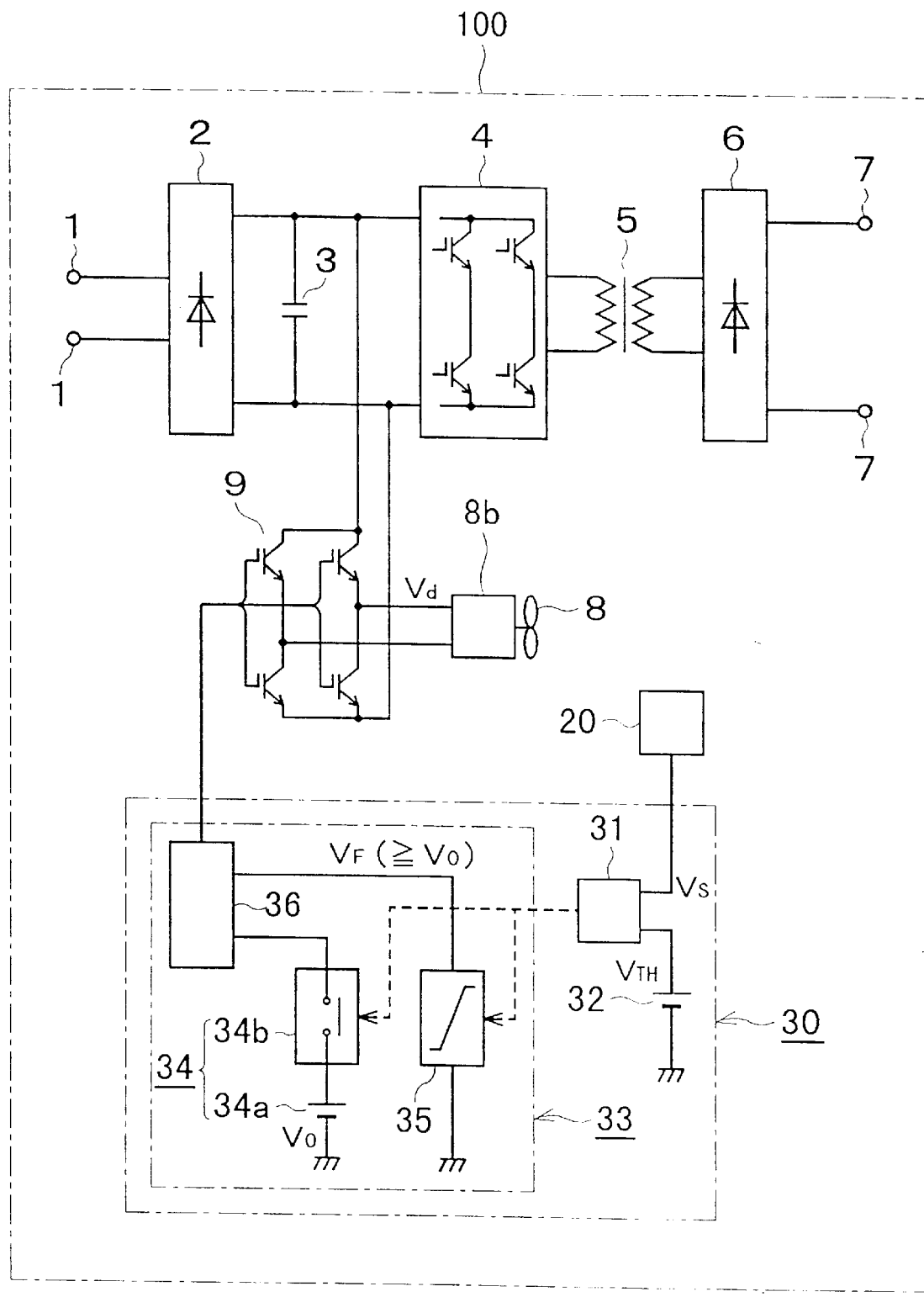
FIG. 6 is a block diagram of a power supply apparatus according to a second embodiment of the present invention.

FIG. 6 illustrates a power supply apparatus according to a second embodiment of the present invention, in which the motor of the fan 8 is an induction motor 8b. The power supply apparatus of the second embodiment includes an inverter 9, instead of the driving unit 10 of the first embodiment. The inverter 9 is controlled by the control unit 30. The power supply apparatus of the second embodiment has a similar configuration to that of the first embodiment, except for the inverter 9 and the motor 8b. Similar components are assigned the same reference numerals and explanation thereof is not made.

The inverter 9 comprises a bridge circuit of semiconductor switching devices, e.g. thyristors, bipolar transistors, or IGBTs. A DC voltage is applied to the inverter 9. The DC voltage is obtained by rectifying an input AC voltage applied between the input terminals 1, 1 by the input rectifier 2 and smoothing the resulting DC voltage by the smoothing capacitor 3. The semiconductor switching devices are ON-OFF controlled by a PWM control pulse signal provided by the PWM control pulse signal generating circuit 36 of the control unit 30, whereby the DC voltage applied to the inverter 9 is converted into an AC voltage, which is applied to the induction motor 8b. The pulse signal generating circuit 36 is adjusted in accordance with the voltage and frequency of the local commercial AC supply used for the power supply apparatus in such a manner that the AC voltage provided by the inverter 9 has a value which can vary in accordance with the temperature T in the housing 100 within a range in which the induction motor 8b can be normally operated, and has a frequency suitable for the induction motor 8b.

As described with respect to the modification of the first embodiment, if the induction motor is used for driving the fan 8, an inverter for converting the DC voltage from the driving unit 10 into an AC voltage should be disposed between the driving unit 10 and the induction motor. The power supply apparatus according to the second embodiment, however, includes the inverter 9, but no driving unit, which results in a simplified configuration.

Figure 7:
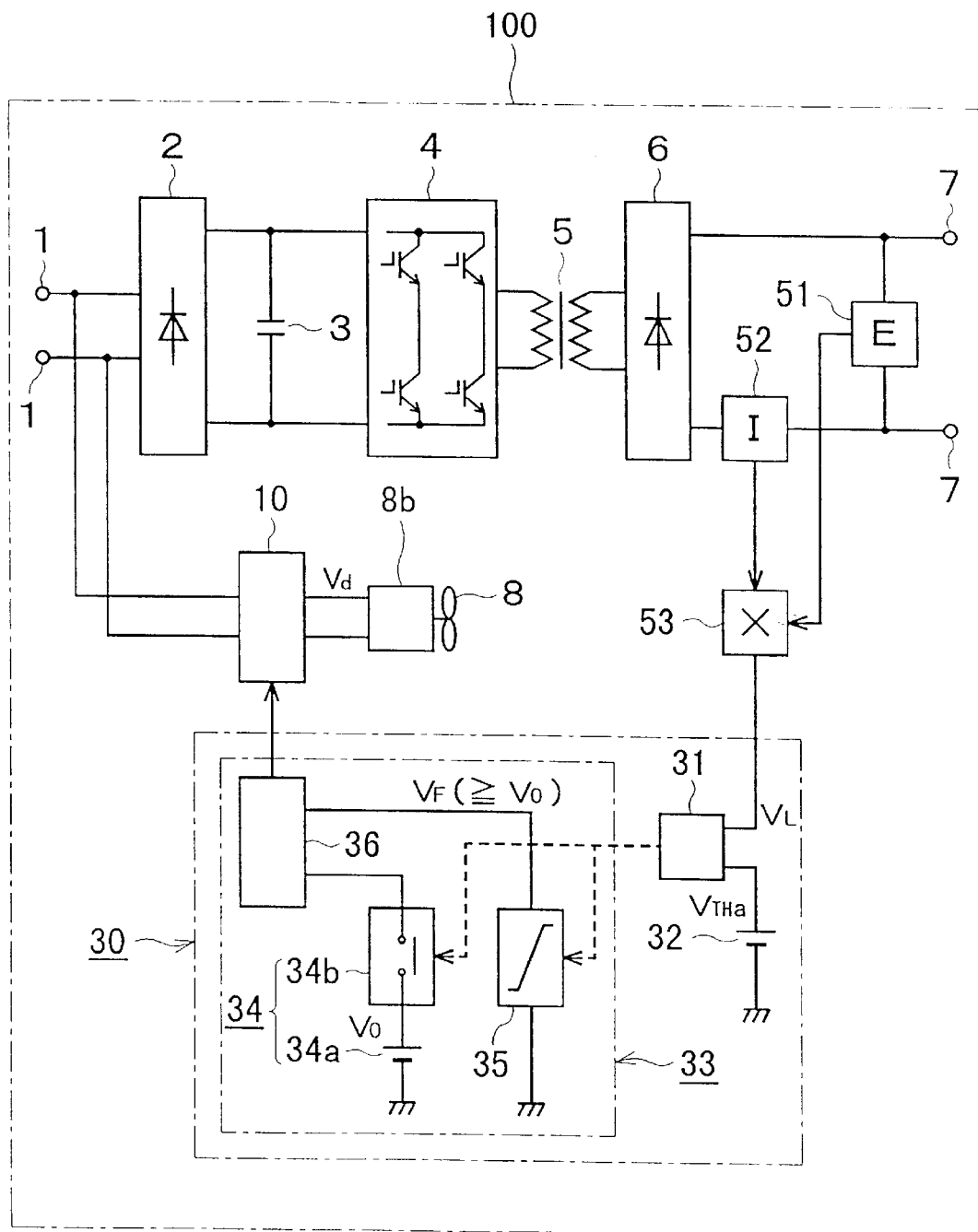
FIG. 7 is a block diagram of a power supply apparatus according to a third embodiment of the present invention.

FIG. 7 illustrates a power supply apparatus according to a third embodiment of the present invention. Similar portions to those of the first embodiment are assigned the same reference numerals and explanation thereof is not made.

The temperature in the housing of the power supply apparatus is correlated with the electrical power consumed by the load to which the power supply apparatus supplies power. The power supply apparatus of the third embodiment takes advantage of this correlation, and includes a voltage detector 51 for detecting an output voltage appearing between the output terminals 7, 7 to generate a voltage representing the detected output voltage. The power supply apparatus also includes a current detector 52 for detecting output current supplied from the output terminals 7, 7 and providing a voltage representing the detected output current. A multiplier 53 multiplies the output voltage representing voltage by the output current representing voltage to provide a power representing voltage $V_L$ which represents power consumed by the load.

The difference between the power representing voltage $V_L$ and a reference voltage $V_{THa}$ from a reference voltage source 32a is calculated by the differential amplifier 31. The reference voltage $V_{THa}$ may be the power representing voltage $V_L$ provided, for example, when the heat sink described with respect to the first embodiment is at about 40° C.

According to the power supply apparatus of the third embodiment, by detecting the consumed power of the load, the temperature T in the housing 100 is indirectly detected, and the rotation speed of the fan 8 is changed accordingly. Thus, the power supply apparatus of the third embodiment has similar advantages to the one of the first embodiment.

It is some time after the power consumed by the load changes that the temperature in the housing 100 changes. Therefore, the change of the temperature in the housing 100 can be predicted by detecting the change of the power representing voltage $V_L$. Thus, according to the power supply apparatus of the third embodiment, the cooling of the components of the power supply apparatus can be started before the temperature in the housing 100 begins to change, which more effectively suppresses temperature increase than in the power supply apparatus of the first embodiment.

When a load operating from a low voltage and large current, such as an arc welder and an arc cutter, is used, the temperature in the housing 100 depends mainly on the magnitude of the load current. In such a case, the rotation speed of the fan 8 may be controlled only by the detected-current representing voltage from the current detector 52. Such arrangement is simpler because it requires neither the voltage detector 51 nor the multiplier 53.

The arrangements described with respect to the modifications of the first embodiment may be used in the second and third embodiments, too.

What is claimed is:

1. A power supply apparatus comprising a housing, a component which generates heat when operating, said component being disposed in said housing, and a fan disposed in said housing for cooling said heat-generating component, wherein said power supply apparatus further comprises:

a driving unit for driving said fan;

a temperature detector for providing a temperature representative signal representing the temperature in said housing;

means for calculating the difference between the value of said temperature representative signal and a predetermined reference value; and control signal generating means for generating a control signal causing said driving unit to apply to said fan a driving voltage for setting the rotation speed of said fan to zero during a time period when said difference indicates that the value of said temperature representative signal is smaller than said reference value, and generating a control signal causing said driving unit to apply to said fan a driving voltage which causes said fan to rotate at a substantially maximum rotation speed for only a predetermined time period in an initial portion of the time period when said difference indicates that the value of said temperature representative signal is equal to or greater than said reference value and then causes said fan to rotate at a rotation speed which is determined in accordance with said difference.

2. The power supply apparatus according to claim 1 wherein said temperature detector detects the temperature in said housing and generates a signal representing the detected temperature.

3. The power supply apparatus according to claim 1 wherein said temperature detector is a power detector for detecting output power of said power supply apparatus and generates a power representative signal representing the detected output power.

4. The power supply apparatus according to claim 3 wherein said power detector comprises:

a voltage detector for detecting an output voltage of said power supply apparatus and generating an output voltage representative signal representing the detected output voltage;

a current detector for detecting an output current of said power supply apparatus and generating an output current representative signal representing the detected output current; and a multiplier for multiplying said output voltage representative signal by said output current representative signal to generate the power representative signal.

5. The power supply apparatus according to claim 3 wherein said temperature detector is a current detector for detecting an output current of said power supply apparatus and generating an output current representative signal representing the detected output current.

6. A power supply apparatus comprising a housing, a component which generates heat when operating, said component being disposed in said housing, and a fan disposed in said housing for cooling said heat-generating component, wherein said power supply apparatus further comprises:

a driving unit for driving said fan;

a power detector for detecting output power of said power supply apparatus and generating a power representative signal representing the detected output power; and a control unit for applying a control signal to said driving unit to change the rotation speed of said fan in accordance with said power representative signal.

7. The power supply apparatus according to claim 6 wherein said power detector comprises:

a voltage detector for detecting an output voltage of said power supply apparatus and generating an output voltage representative signal representing the detected output voltage;

a current detector for detecting an output current of said power supply apparatus and generating an output current representative signal representing the detected output current; and a multiplier for multiplying said output voltage representative signal by said output current representative signal to generate the power representative signal.

8. The power supply apparatus according to claim 6 wherein:

said power supply apparatus is used with an arc welder or arc cutter; and said power detector detects an output current proportional to output power of said power supply apparatus and generates an output current representative signal representing the detected output current.

9. The power supply apparatus according to claim 6 wherein said control unit comprises:

means for calculating the difference between the value of said power representative signal and a predetermined reference value; and control signal generating means generating a control signal for setting the rotation speed of said fan to a predetermined constant value when said difference indicates that the value of said power representative signal is smaller than said reference value, and for setting the rotation speed of said fan to a value which is greater than said predetermined constant value and is determined in accordance with said difference when said difference indicates that the value of said power representative signal is equal to or greater than said reference value.

10. The power supply apparatus according to claim 9 wherein said power detector comprises:

a voltage detector for detecting an output voltage of said power supply apparatus and generating an output voltage representative signal representing the detected output voltage;

a current detector for detecting an output current of said power supply apparatus and generating an output current representative signal representing the detected output current; and a multiplier for multiplying said output voltage representative signal by said output current representative signal to generate the power representative signal.

11. The power supply apparatus according to claim 9 wherein:

said power supply apparatus is used with an arc welder or arc cutter; and said power detector detects an output current proportional to output power of said power supply apparatus and generates an output current representative signal representing the detected output current.

* * * * *